US008378368B2

(12) United States Patent
Hsu et al.

(10) Patent No.: US 8,378,368 B2
(45) Date of Patent: Feb. 19, 2013

(54) LIGHT-EMITTING DIODE STRUCTURE

(75) Inventors: Chia-Yun Hsu, Taipei County (TW); Chih-Hung Hsu, Taipei County (TW)

(73) Assignee: Everlight Electronics Co., Ltd. (TW)

( * ) Notice: Subject to any disclaimer, the term of this patent is extended or adjusted under 35 U.S.C. 154(b) by 0 days.

(21) Appl. No.: 12/772,405

(22) Filed: May 3, 2010

(65) Prior Publication Data

US 2011/0079806 A1    Apr. 7, 2011

(30) Foreign Application Priority Data

Oct. 2, 2009    (TW) .............................. 98133559 A

(51) Int. Cl.
*H01L 33/00*    (2010.01)
*H01L 23/495*    (2006.01)

(52) U.S. Cl. ............ 257/98; 257/99; 257/100; 257/676; 257/E33.057; 257/E33.059; 257/E33.068; 257/E33.073; 257/E33.074

(58) Field of Classification Search .................. None
See application file for complete search history.

(56) References Cited

U.S. PATENT DOCUMENTS

| | | | | |
|---|---|---|---|---|
| 3,821,590 A * | 6/1974 | Kosman et al. | ............... | 313/499 |
| 5,013,144 A * | 5/1991 | Silverglate et al. | ............ | 359/709 |
| 5,175,783 A * | 12/1992 | Tatoh | .............................. | 385/93 |
| 5,865,529 A * | 2/1999 | Yan | ................................. | 362/327 |
| 6,488,392 B1 * | 12/2002 | Lu | .................................. | 362/308 |
| 6,639,733 B2 * | 10/2003 | Minano et al. | ................. | 359/728 |
| 6,674,096 B2 * | 1/2004 | Sommers | .......................... | 257/98 |
| 6,724,543 B1 * | 4/2004 | Chinniah et al. | .............. | 359/718 |
| 6,755,556 B2 * | 6/2004 | Gasquet et al. | ............... | 362/329 |
| 6,811,277 B2 * | 11/2004 | Amano | .......................... | 362/602 |
| 6,953,271 B2 * | 10/2005 | Aynie et al. | .................... | 362/511 |
| 6,997,580 B2 * | 2/2006 | Wong | ........................ | 362/311.02 |
| 7,142,769 B2 * | 11/2006 | Hsieh et al. | .................... | 385/146 |
| 7,193,365 B2 * | 3/2007 | Ishizaka | ........................ | 313/512 |
| 7,254,309 B1 * | 8/2007 | Chou et al. | .................... | 385/146 |
| 7,347,590 B2 * | 3/2008 | Lee et al. | ....................... | 362/327 |
| 7,473,013 B2 * | 1/2009 | Shimada | ....................... | 362/327 |
| 7,748,873 B2 * | 7/2010 | Kim et al. | ...................... | 362/328 |
| 7,781,789 B2 * | 8/2010 | DenBaars et al. | .............. | 257/98 |
| 7,800,125 B2 * | 9/2010 | Chen | ............................... | 257/98 |
| 7,862,221 B2 * | 1/2011 | Park et al. | ..................... | 362/612 |
| 7,872,273 B2 * | 1/2011 | Lin et al. | ......................... | 257/98 |
| 8,105,853 B2 * | 1/2012 | Xu | .................................. | 438/27 |

(Continued)

FOREIGN PATENT DOCUMENTS

CN    1586017    2/2005
TW    200305291    10/2003

(Continued)

*Primary Examiner* — Hoang-Quan Ho
(74) *Attorney, Agent, or Firm* — Andy M. Han; Han IP Law PLLC

(57) ABSTRACT

A light-emitting diode structure is provided. The light-emitting diode structure includes a light-emitting diode chip, a lead frame for electrically connecting and supporting the light-emitting diode chip, and a lens covering the light-emitting diode chip and to partially cover the lead frame. A recess disposed on the upper portion of the lens has a ladder-like inner wall formed of an upper inclined wall portion, a lower inclined wall portion, and a connecting wall portion connected to the upper and lower inclined wall portions. The slope of the upper inclined wall portion is greater than that of the lower inclined wall portion, and the slope of the connecting wall portion is greater than the upper and lower inclined wall portions.

17 Claims, 5 Drawing Sheets

U.S. PATENT DOCUMENTS

| | | | |
|---|---|---|---|
| 2004/0084681 A1* | 5/2004 | Roberts | 257/79 |
| 2004/0256628 A1* | 12/2004 | Chin et al. | 257/98 |
| 2005/0024744 A1* | 2/2005 | Falicoff et al. | 359/737 |
| 2006/0119250 A1* | 6/2006 | Suehiro et al. | 313/498 |
| 2006/0238884 A1* | 10/2006 | Jang et al. | 359/653 |
| 2007/0051960 A1* | 3/2007 | Yu | 257/88 |
| 2007/0187705 A1* | 8/2007 | Tanaka et al. | 257/98 |
| 2007/0217195 A1* | 9/2007 | Chen et al. | 362/255 |
| 2008/0111146 A1* | 5/2008 | Nakamura et al. | 257/98 |
| 2008/0128730 A1* | 6/2008 | Fellows et al. | 257/98 |
| 2008/0142822 A1* | 6/2008 | Kim et al. | 257/98 |
| 2008/0179614 A1* | 7/2008 | Wang et al. | 257/98 |
| 2008/0191232 A1* | 8/2008 | Lee et al. | 257/98 |
| 2008/0254557 A1* | 10/2008 | Kim et al. | 438/27 |
| 2008/0296589 A1* | 12/2008 | Speier et al. | 257/82 |
| 2009/0279286 A1* | 11/2009 | Chen et al. | 362/97.3 |
| 2009/0283784 A1* | 11/2009 | Chang | 257/98 |
| 2010/0006877 A1* | 1/2010 | Chen | 257/98 |
| 2010/0213480 A1* | 8/2010 | Jung et al. | 257/98 |
| 2010/0237360 A1* | 9/2010 | Kao et al. | 257/88 |
| 2010/0320480 A1* | 12/2010 | Rapoport et al. | 257/88 |

FOREIGN PATENT DOCUMENTS

| | | |
|---|---|---|
| TW | 200417059 | 9/2004 |
| TW | 200613768 | 5/2006 |

* cited by examiner

LIGHT-EMITTING DIODE STRUCTURE

CROSS REFERENCE TO RELATED APPLICATIONS

This Application claims priority of Taiwan Patent Application No. 098133559, filed on Oct. 2, 2009, the entirety of which is incorporated by reference herein.

BACKGROUND OF THE INVENTION

1. Field of the Invention

The present invention relates to a light-emitting diode structure, and in particular relates to a light-emitting diode structure with an improved light pattern that is sufficient to be used for decorative lights.

2. Description of the Related Art

FIG. 1 is a schematic view of a conventional lateral light-emitting diode (LED) structure 100. The conventional lateral light-emitting diode structure 100 comprises a light-emitting diode chip 130, a lead frame 120 and a lens 110.

The lead frame 120 is utilized to support the light-emitting diode chip 130 and electrically connects the light-emitting diode chip 130 to an external circuit (not shown in FIGs.).

The lens 110 is utilized to cover the light-emitting diode chip 130 and to partially cover the lead frame 120. The lens 110 is made of a resin, and the shape of the lens 110 is substantially cylindrical. The lens 110 comprises an upper portion and a conical recess 112 disposed on the upper portion. That is, the conical recess 112 has a rounded cross section, and the radius at the deeper site thereof is less than that at the shallow site thereof.

In operation, when a light, upwardly emitted from the light-emitting diode chip 130, reaches the inner wall of the conical recess 112, the majority of the light reflected by the inner wall of the conical recess 112 is transformed into a lateral light, and only a portion of the light passing through the inner wall of the conical recess 112 is transformed into a normal light.

Due to the low intensity of the normal light of the conventional lateral light-emitting diode structure 100, the conventional lateral light-emitting diode structure 100 is not sufficient to be used for decorative lights.

BRIEF SUMMARY OF THE INVENTION

In view of the limited applications of the conventional lateral light-emitting diode structure described above, the invention provides a light-emitting diode structure with an improved light pattern that is sufficient to be used for decorative lights.

In one embodiment of the invention, the light-emitting diode structure comprises a light-emitting diode chip, a lead frame and a lens. The lead frame is utilized for electrical connection and support of the light-emitting diode chip. The lens is utilized to cover the light-emitting diode chip and to partially cover the lead frame. The lens comprises an upper portion and a recess disposed on the upper portion and having a ladder-like inner wall which is formed of an upper inclined wall portion and a lower inclined wall portion, wherein the upper inclined wall portion has a slope greater than that of the lower inclined wall portion.

In one embodiment of the invention, the ladder-like inner wall of the recess of the lens further comprises a connecting wall portion connected to the upper and lower inclined wall portions, and the connecting wall portion has a slope greater than that of the upper inclined wall portion and that of the lower inclined wall portion.

In one embodiment of the invention, the lens comprises a cylindrical lens.

In one embodiment of the invention, the lens further comprises an outer wall and a guiding angle disposed at a common boundary of the inner wall of the recess and the outer wall. The guiding angle has a rounded or slanted angle.

In one embodiment of the invention, the recess of the lens is a rounded cross section and inner diameters reduced gradually from top to bottom.

In one embodiment of the invention, the lens is made of a resin.

In one embodiment of the invention, a light-emitting diode structure comprises a light-emitting diode chip, a lead frame and a cylindrical lens. The lead frame is utilized for electrical connection and support of the light-emitting diode chip. The cylindrical lens is utilized to cover the light-emitting diode chip and to partially cover the lead frame. The cylindrical lens comprises an upper portion and a recess disposed on the upper portion and having a ladder-like inner wall which is formed of an upper inclined wall portion, a lower inclined wall portion and a connecting wall portion connected to the upper and lower inclined wall portions, wherein the upper inclined wall portion has a slope greater than that of the lower inclined wall portion, and the connecting wall portion has a slope greater than that of the upper inclined wall portion and that of the lower inclined wall portion.

In one embodiment of the invention, the cylindrical lens further comprises an outer wall and a guiding angle disposed at a common boundary of the inner wall of the recess and the outer wall. The guiding angle has a rounded or slanted angle.

In one embodiment of the invention, the recess of the cylindrical lens comprises a rounded cross section and inner diameters reduced gradually from top to bottom.

In one embodiment of the invention, the cylindrical lens is made of a resin.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
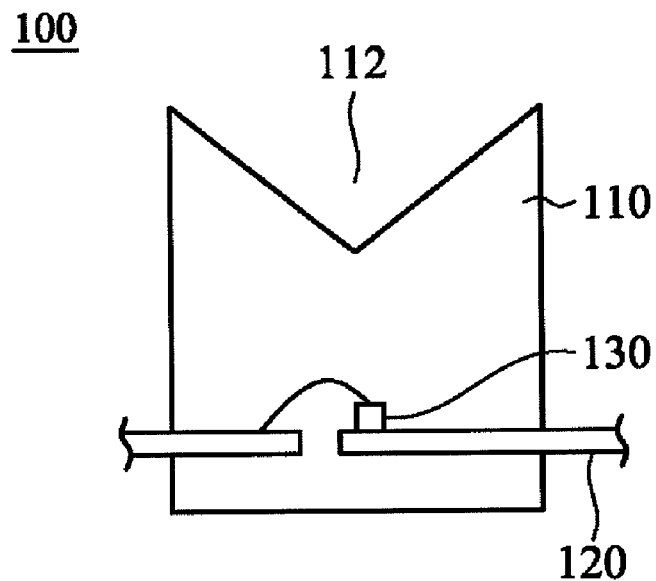
FIG. 1 is a schematic view of a conventional lateral light-emitting diode structure.
Figure 2:
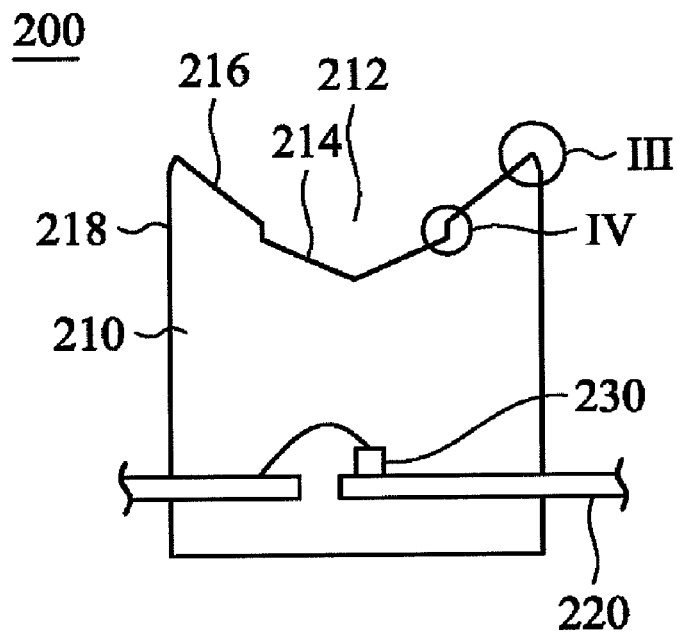
FIG. 2 is a schematic view of a light-emitting diode structure of a first embodiment of the invention.

FIG. 2 is a schematic view of a light-emitting diode structure 200 of a first embodiment. The light-emitting diode structure 200 comprises a light-emitting diode chip 230, a lead frame 220 and a lens 210.

The lead frame 220 is utilized to support the light-emitting diode chip 230 and electrically connect the light-emitting diode chip 230 to an external circuit (not shown in FIGs.).

The lens 210 is utilized to cover the light-emitting diode chip 230 and to partially cover the lead frame 220. In this embodiment, the lens 210 is made of a resin, and the shape of the lens 210 is substantially cylindrical. The lens 210 comprises an upper portion and a recess 212 disposed on the upper portion. Although the recess 212 is not formed as a cone, the cross section of the recess 212 is still round, and the inner diameter at the deeper site thereof is less than that at the shallow site thereof. That is, the recess 212 of the lens 210 comprises a rounded cross section and inner diameters reduced gradually from top to bottom.

The recess 212 has a ladder-like inner wall which is formed of an upper inclined wall portion 216, a lower inclined wall portion 214 and a connecting wall portion 215 connected to the upper and lower inclined wall portions 216 and 214, and a slope with a slanted angle θ of the connecting wall portion 215 is greater than a slope with a slanted angle θ1 of the upper inclined wall portion 216 and a slope with a slanted angle θ2 of the lower inclined wall portion 214.

In operation, when a light, upwardly emitted from the light-emitting diode chip 230, reaches the lower inclined wall portion 214 and the upper inclined wall portion 216 of the recess 212, a part of the light reflected by the lower inclined wall portion 214 and the upper inclined wall portion 216 of the recess 212 is transformed into a lateral light, and another part of the light passing through the lower inclined wall portion 214 and the upper inclined wall portion 216 of the recess 212 is transformed into a normal light.

Figure 3:
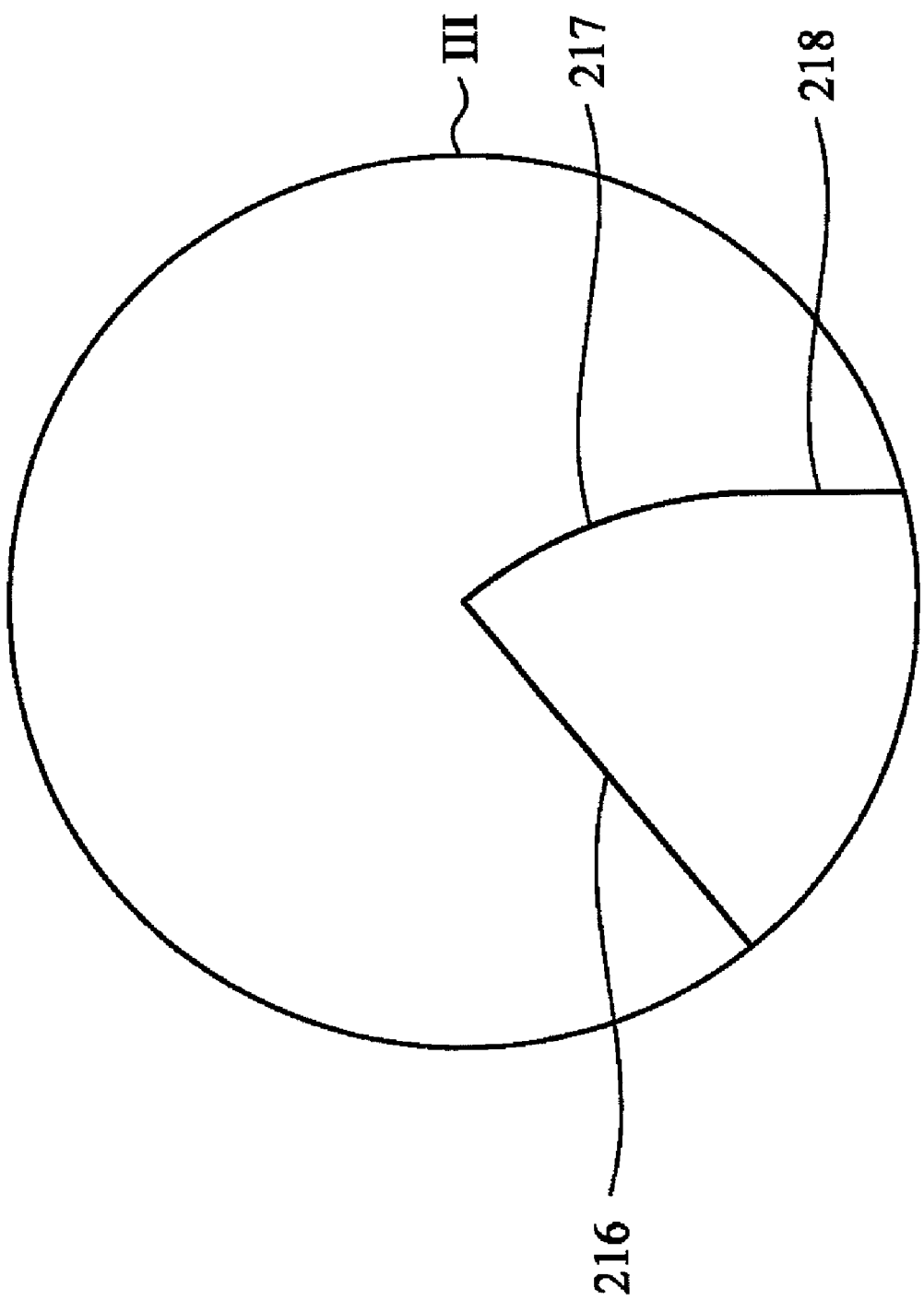
FIG. 3 is a partial enlarged view of the light-emitting diode structure of FIG. 2.

FIG. 3 is a partial enlarged view of the light-emitting diode structure 200 of FIG. 2. A guiding angle 217 is disposed at a common boundary of the upper inclined wall portion 216 of the inner wall of the recess 212 and an outer wall 218 of the lens 210 to increase the intensity of the normal light. In this embodiment, the guiding angle 217 is a rounded angle, and the guiding angle 217 can be a slanted angle in a second embodiment which will be described later.

Figure 4:
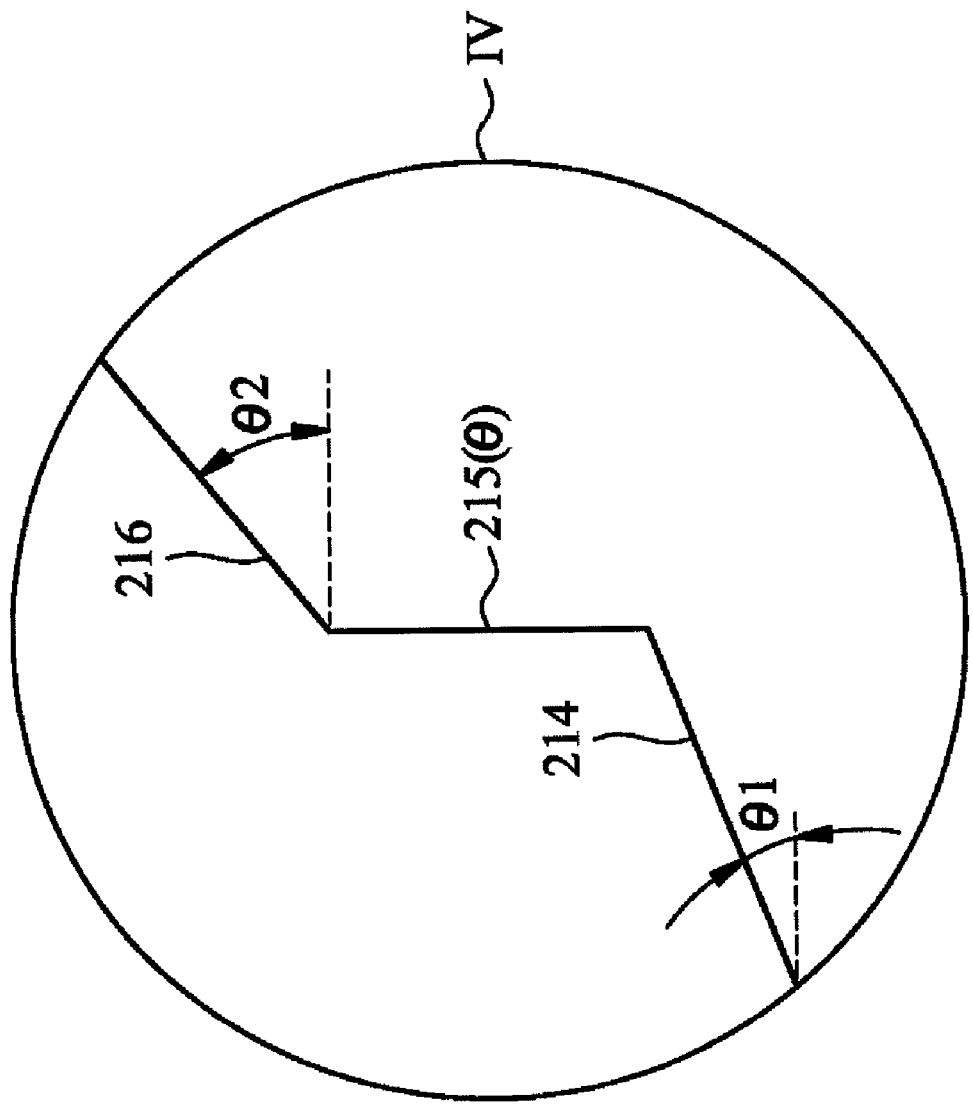
FIG. 4 is another partial enlarged view of the light-emitting diode structure of FIG. 2.

The recess 212 is designed to be ladder-like, to generate an extended visual emitting light effect. Referring to FIGS. 2 and 4, FIG. 4 is another partial enlarged view of the light-emitting diode structure 200 of FIG. 2. With respect to the ladder-like inner wall of the recess 212, the lower inclined wall portion 214 at the deeper site has the slope with the slanted angle θ1 which is less than the slope with the slanted angle θ2 of the upper inclined wall portion 216.

Due the features of the light-emitting diode structure 200, the light-emitting diode structure 200 is sufficient to be used for decorative lights. The light pattern differences between the light-emitting diode structure 200 of the first embodiment and the conventional lateral light-emitting diode structure 100 made by computer simulation will be described below.

Figure 5:
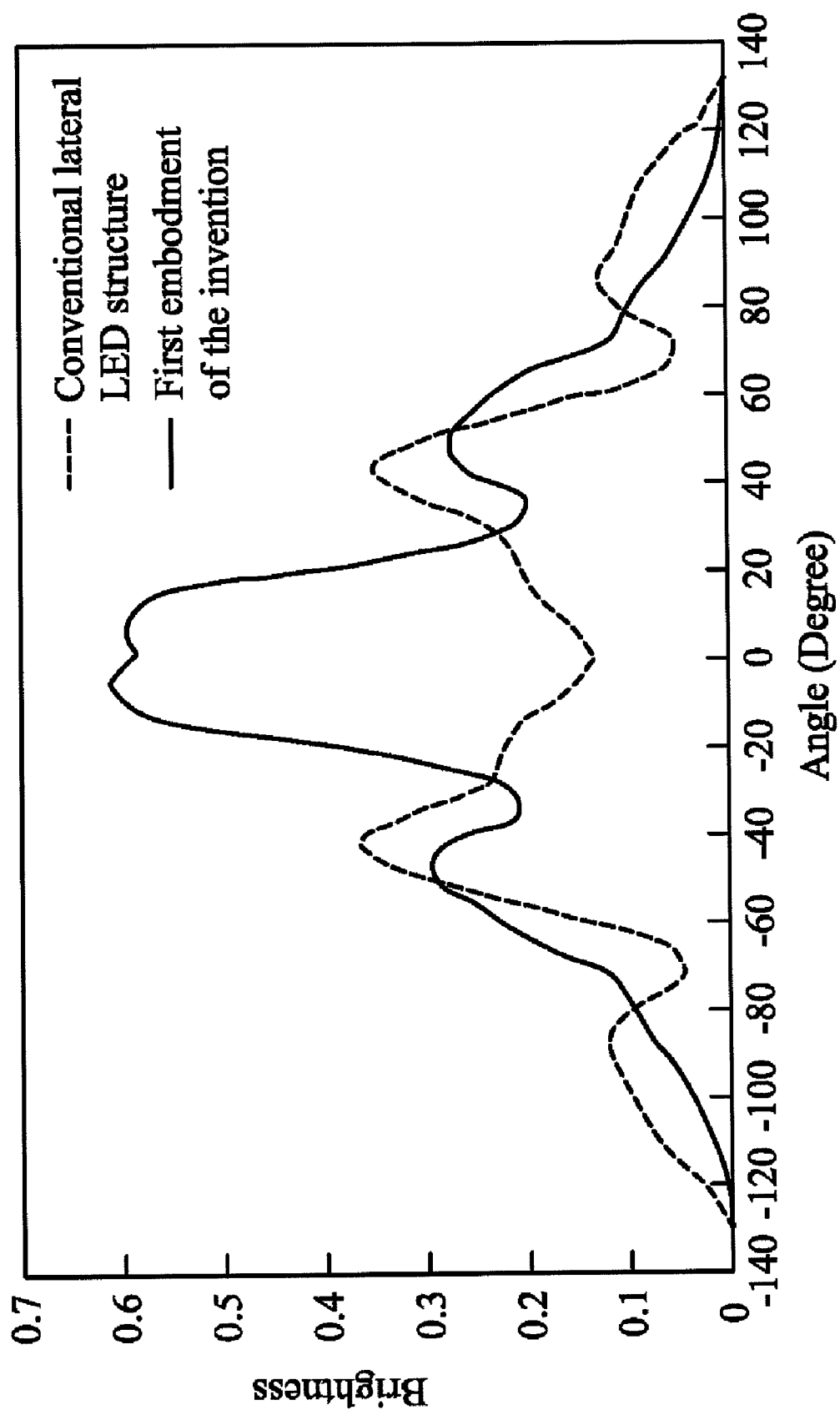
FIG. 5 is a light-emitting angle distribution diagram obtained from a computer simulation between the light-emitting diode structure of the first embodiment of the invention and the conventional lateral light-emitting diode structure.

FIG. 5 is a light-emitting angle distribution diagram obtained from a computer simulation between the light-emitting diode structure 200 of the first embodiment and the conventional lateral light-emitting diode structure 100. In FIG. 5, it is shown that the brightness of the light-emitting diode structure 200 at the deeper site (above 90 degrees, below −90 degrees) of the light-emitting diode structure 200 is reduced, and the brightness of the light-emitting diode structure 200 located at the direction of zero degree)(0° is increased, when compared to that of the conventional lateral light-emitting diode structure 100.

Figure 6:
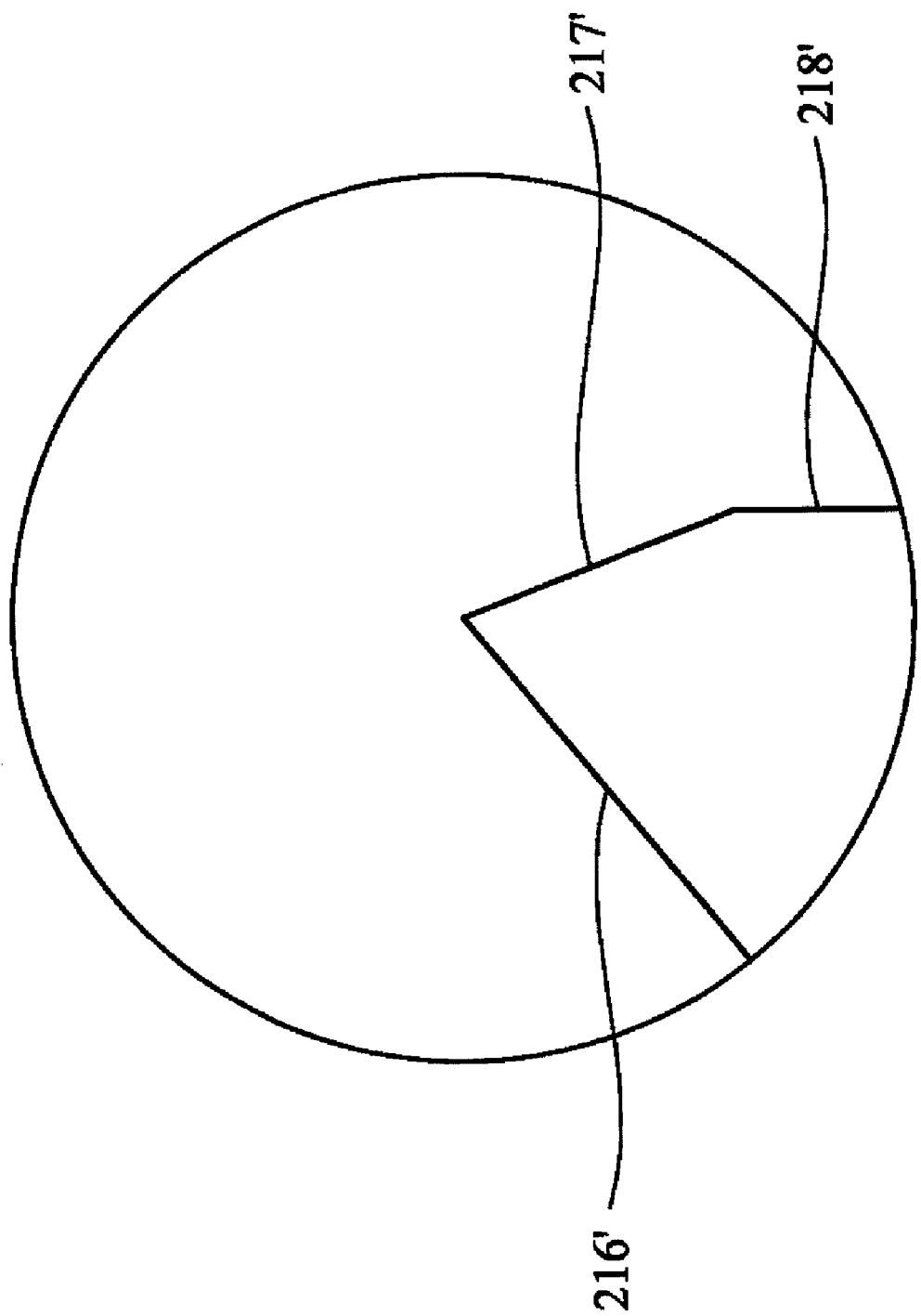
FIG. 6 is a schematic view of a light-emitting diode structure of a second embodiment of the invention.

FIG. 6 is a schematic view of a light-emitting diode structure of a second embodiment. A guiding angle 217' is disposed at a common boundary of the upper inclined wall portion 216' of the inner wall of the recess and the outer wall 218' of the lens to increase the intensity of the normal light. Other structures of the light-emitting diode structure of the second embodiment are the same as the light-emitting diode structure 200 of the first embodiment and their descriptions thereby are omitted.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A light-emitting diode structure, comprising:
a light-emitting diode chip that emits light;
a lead frame electrically connecting and supporting the light-emitting diode chip; and
a lens covering the light-emitting diode chip and partially covering the lead frame, the lens comprising an upper portion and a recess disposed on the upper portion, the recess having a rounded cross section, gradually reduced inner diameters and a ladder-like inner wall, wherein the ladder-like inner wall has an upper inclined wall portion and a lower inclined wall portion, wherein the lower inclined wall portion forms an inverse conical shape at a bottom of the recess, wherein an angle of the upper inclined wall portion with respect to a plane that is perpendicular to an optical axis of the lens is greater than an angle of the lower inclined wall portion with respect to the plane, and
wherein a part of the light passes through the lower inclined wall portion and the upper inclined wall portion such that an intensity of a normal light emitted out of the light-emitting diode structure is increased.

2. The light-emitting diode structure as recited in claim 1, wherein the ladder-like inner wall of the recess of the lens further comprises a connecting wall portion connected to the upper and lower inclined wall portions, and wherein an angle of the connecting wall portion with respect to the plane that is perpendicular to the optical axis of lens is greater than the angle of the upper inclined wall portion with respect to the plane and the angle of the lower inclined wall portion with respect to the plane, respectively.

3. The light-emitting diode structure as recited in claim 1, wherein the lens comprises a substantially cylindrical lens.

4. The light-emitting diode structure as recited in claim 3, wherein the substantially cylindrical lens further comprises a guiding angle disposed at a common boundary of the ladder-like inner wall of the recess and an outer wall of the lens.

5. The light-emitting diode structure as recited in claim 4, wherein the guiding angle comprises a rounded angle.

6. The light-emitting diode structure as recited in claim 4, wherein the guiding angle comprises a slanted angle.

7. The light-emitting diode structure as recited in claim 1, wherein the lens comprises a resin.

8. A light-emitting diode structure, comprising:
a light-emitting diode chip that emits light;
a lead frame for electrically connecting and supporting the light-emitting diode chip; and
a substantially cylindrical lens covering the light-emitting diode chip and partially covering the lead frame, comprising an upper portion and a recess, the recess having a ladder-like inner wall and disposed on the upper portion, wherein the ladder-like inner wall has an upper inclined wall portion, a lower inclined wall portion, and a connecting wall portion between the upper and lower inclined wall portions, wherein the lower inclined wall portion forms an inverse conical shape at a bottom of the recess, wherein an angle of the upper inclined wall portion with respect to a plane that is perpendicular to an optical axis of the lens is greater than an angle of the lower inclined wall portion with respect to the plane, and wherein an angle of the connecting wall portion with respect to the plane is greater than the angle of the upper inclined wall portion with respect to the plane and the angle of the lower inclined wall portion with respect to the plane, respectively.

9. The light-emitting diode structure as recited in claim 8, wherein the substantially cylindrical lens further comprises a guiding angle disposed at a common boundary of the ladder-like inner wall of the recess and an outer wall of the substantially cylindrical lens.

10. The light-emitting diode structure as recited in claim 9, wherein the guiding angle comprises a rounded angle.

11. The light-emitting diode structure as recited in claim 9, wherein the guiding angle comprises a slanted angle.

12. The light-emitting diode structure as recited in claim 8, wherein the recess of the substantially cylindrical lens comprises a rounded cross section and inner diameters reduced gradually from top to bottom.

13. The light-emitting diode structure as recited in claim 8, wherein the substantially cylindrical lens comprises a resin.

14. A light-emitting diode structure, comprising:
a light-emitting diode chip that emits light;
a lead frame for electrically connecting and supporting the light-emitting diode chip; and
a lens covering the light-emitting diode chip and partially covering the lead frame, the lens comprising an upper portion, a recess having a ladder-like inner wall disposed on the upper portion, and a guiding angle disposed at a common boundary of the ladder-like inner wall of the recess and an outer wall of the lens, wherein the ladder-like inner wall has an upper inclined wall portion and a lower inclined wall portion, wherein the lower inclined wall portion forms an inverse conical shape at a bottom of the recess, and wherein an angle of the upper inclined wall portion with respect to a plane that is perpendicular to an optical axis of the lens is greater than an angle of the lower inclined wall portion with respect to the plane.

15. The light-emitting diode structure as recited in claim 14, wherein the ladder-like inner wall of the recess of the lens further comprises a connecting wall portion between the upper and lower inclined wall portions, and wherein an angle of the connecting wall portion with respect to the plane that is perpendicular to the optical axis of the lens is greater than the angle of the upper inclined wall portion with respect to the plane and the angle of the lower inclined wall portion with respect to the plane, respectively.

16. The light-emitting diode structure as recited in claim 14, wherein a part of the light passes through the ladder-like inner wall such that a brightness of the light emitted from the light-emitting diode chip located at zero degree with respect to the optical axis is larger than a brightness of the light located above ninety degrees or below minus ninety degrees with respect to the optical axis.

17. The light-emitting diode structure as recited in claim 14, wherein the guiding angle comprises a rounded angle or a slanted angle.

* * * * *